(12) United States Patent
Yu

(10) Patent No.: US 6,342,410 B1
(45) Date of Patent: Jan. 29, 2002

(54) FABRICATION OF A FIELD EFFECT TRANSISTOR WITH THREE SIDED GATE STRUCTURE ON SEMICONDUCTOR ON INSULATOR

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 58 days.

(21) Appl. No.: 09/612,781

(22) Filed: Jul. 10, 2000

(51) Int. Cl.[7] ............................................... H01L 21/84
(52) U.S. Cl. ........................................................ 438/164
(58) Field of Search ................................ 438/585, 592, 438/593, 595, 151, 163, 164

(56) References Cited

U.S. PATENT DOCUMENTS 6,114,725 A * 9/2000 Furukawa et al. .......... 257/330
6,121,651 A * 9/2000 Furukawa et al. .......... 257/296

OTHER PUBLICATIONS

Xuejue Huang et al., Sub 50–nm FinFet: PMOS, IEDM 1999.

* cited by examiner

*Primary Examiner*—David Nelms
*Assistant Examiner*—Quoc Hoang

(74) *Attorney, Agent, or Firm*—Monica I. Choi

(57) ABSTRACT

For fabricating a field effect transistor, a semiconductor pillar is formed on a layer of insulating material with a top surface and first and second side surfaces of the semiconductor pillar being exposed. A layer of dielectric material is formed on the top surface and the first and second side surfaces of the semiconductor pillar. A layer of conductive material is deposited on the layer of dielectric material on the top surface and the first and second side surfaces of the semiconductor pillar. A dummy dielectric structure is formed that covers a portion of the layer of conductive material such that a remaining portion of the layer of conductive material on the semiconductor pillar is exposed. The dummy dielectric structure has a predetermined sidewall on the layer of conductive material on the semiconductor pillar. A layer of hardmask dielectric is deposited on top and on the predetermined sidewall of the dummy dielectric structure and on the remaining portion of the layer of conductive material that is exposed. The layer of hardmask dielectric is anisotropically etched such that the hardmask dielectric remains at the predetermined sidewall of the dummy dielectric structure to form a spacer of hardmask dielectric. Any exposed region of the layer of conductive material and the layer of dielectric material not covered by the spacer of hardmask dielectric is etched away. The conductive material and the dielectric material that remain on the top surface and the first and second side surfaces at the gate portion of the semiconductor pillar form a three-sided gate structure and a three-sided gate dielectric of the field effect transistor for minimizing short channel effects in the field effect transistor.

14 Claims, 7 Drawing Sheets

FABRICATION OF A FIELD EFFECT TRANSISTOR WITH THREE SIDED GATE STRUCTURE ON SEMICONDUCTOR ON INSULATOR

TECHNICAL FIELD

The present invention relates generally to fabrication of field effect transistors having scaled-down dimensions, and more particularly, to fabrication of a field effect transistor with a three sided gate structure in SOI (semiconductor on insulator) technology for minimization of short channel effects for the field effect transistor having scaled down dimensions of tens of nanometers.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Referring to FIG. 1, a common component of a monolithic IC is a MOSFET (Metal Oxide Semiconductor Field Effect Transistor) 100 which is fabricated within a semiconductor substrate 102. The scaled down MOSFET 100 having submicron or nanometer dimensions includes a drain extension 104 and a source extension 106 formed within an active device area 126 of the semiconductor substrate 102. The drain extension 104 and the source extension 106 are shallow junctions to minimize short-channel effects in the MOSFET 100 having submicron or nanometer dimensions, as known to one of ordinary skill in the art of integrated circuit fabrication.

The MOSFET 100 further includes a drain contact junction 108 with a drain silicide 110 for providing contact to the drain of the MOSFET 100 and includes a source contact junction 112 with a source silicide 114 for providing contact to the source of the MOSFET 100. The drain contact junction 108 and the source contact junction 112 are fabricated as deeper junctions such that a relatively large size of the drain silicide 110 and the source silicide 114 respectively may be fabricated therein to provide low resistance contact to the drain and the source respectively of the MOSFET 100.

The MOSFET 100 further includes a gate dielectric 116 and a gate electrode 118 which may be comprised of polysilicon. A gate silicide 120 is formed on the polysilicon gate electrode 118 for providing contact to the gate of the MOSFET 100. The MOSFET 100 is electrically isolated from other integrated circuit devices within the semiconductor substrate 102 by shallow trench isolation structures 121. The shallow trench isolation structures 121 define the active device area 126, within the semiconductor substrate 102, where the MOSFET 100 is fabricated therein.

The MOSFET 100 also includes a spacer 122 disposed on the sidewalls of the gate electrode 118 and the gate dielectric 116. When the spacer 122 is comprised of silicon nitride (SiN), then a spacer liner oxide 124 is deposited as a buffer layer between the spacer 122 and the sidewalls of the gate electrode 118 and the gate dielectric 116.

As the dimensions of the MOSFET 100 are scaled down to tens of nanometers, short channel effects degrade the performance of the MOSFET 100. Short channel effects that result due to the short length of the channel between the drain extension 104 and the source extension 106 of the MOSFET 100 are known to one of ordinary skill in the art of integrated circuit fabrication. Because short channel effects may severely degrade the performance of the MOSFET, mechanisms are desired for minimizing short channel effects in a MOSFET having scaled down dimensions of tens of nanometers.

SUMMARY OF THE INVENTION

Accordingly, in a general aspect of the present invention, a semiconductor pillar is formed in SOI (silicon on insulator) technology with a three-sided gate structure. The three-sided gate structure contacts a gate portion of the semiconductor pillar at three sides of the semiconductor pillar for enhanced control of charge accumulation in the gate portion of the semiconductor pillar. With such enhanced control, short channel effects of the MOSFET formed with such a three-sided gate structure are minimized.

In one embodiment of the present invention, for fabricating a field effect transistor, a semiconductor pillar is formed on a layer of insulating material with a top surface and first and second side surfaces of the semiconductor pillar being exposed. A layer of dielectric material is formed on the top surface and the first and second side surfaces of the semiconductor pillar. A layer of conductive material is deposited on the layer of dielectric material on the top surface and the first and second side surfaces of the semiconductor pillar.

A dummy dielectric structure is formed that covers a portion of the layer of conductive material such that a remaining portion of the layer of conductive material on the semiconductor pillar is exposed. The dummy dielectric structure has a predetermined sidewall on the layer of conductive material on the semiconductor pillar.

A layer of hardmask dielectric is deposited on top and on the predetermined sidewall of the dummy dielectric structure and on the remaining portion of the layer of conductive material that is exposed. The layer of hardmask dielectric is anisotropically etched such that the hardmask dielectric remains at the predetermined sidewall of the dummy dielectric structure to form a spacer of hardmask dielectric.

The dummy dielectric structure is etched away such that the spacer of hardmask dielectric remains. The spacer of hardmask dielectric covers the layer of conductive material on the top surface and the first and second side surfaces of the semiconductor pillar at a gate portion of the semiconductor pillar. Any exposed region of the layer of conductive material and the layer of dielectric material not covered by the spacer of hardmask dielectric is etched away such that the conductive material and the dielectric material remain on the top surface and the first and second side surfaces at the gate portion of the semiconductor pillar The conductive material that remains on the top surface and the first and second side surfaces at the gate portion of the semiconductor pillar forms a three-sided gate structure of the field effect transistor. In addition, the dielectric material that remains on the top surface and the first and second side surfaces at the gate portion of the semiconductor pillar forms a three-sided gate dielectric of the field effect transistor.

The present invention may be used to particular advantage when the semiconductor pillar is comprised of silicon, the layer of insulating material is comprised of silicon dioxide ($SiO_2$), the layer of dielectric material is comprised of silicon dioxide ($SiO_2$), the layer of conductive material is comprised of polysilicon, the dummy dielectric structure is comprised of silicon nitride ($Si_3N_4$), and/or the layer of hardmask dielectric is comprised of silicon dioxide ($SiO_2$).

In another embodiment of the present invention, for fabricating a MOSFET (metal oxide semiconductor field effect transistor), the spacer of the hardmask dielectric is etched away. A drain contact pad is formed at a first end of the semiconductor pillar, and a source contact pad is formed at a second end of the semiconductor pillar. A dopant is implanted into exposed regions of the semiconductor pillar to form a drain region within the semiconductor pillar at a first side of the gate portion toward the first end of the semiconductor pillar, and to form a source region within the semiconductor pillar at a second side of the gate portion toward the second end of the semiconductor pillar. A gate spacer is formed to surround the gate structure and the gate dielectric. A gate silicide is formed with the gate structure, a drain silicide is formed with the drain region, and a source silicide is formed with the source region.

In this manner, the three-sided gate structure contacts a gate portion of the semiconductor pillar at three sides of the semiconductor pillar for enhanced control of charge accumulation in the gate portion of the semiconductor pillar. With such enhanced control, short channel effects of the MOSFET formed with such a three-sided gate structure are minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, 19, and 20 refer to elements having similar structure and function.

DETAILED DESCRIPTION

Figure 1:
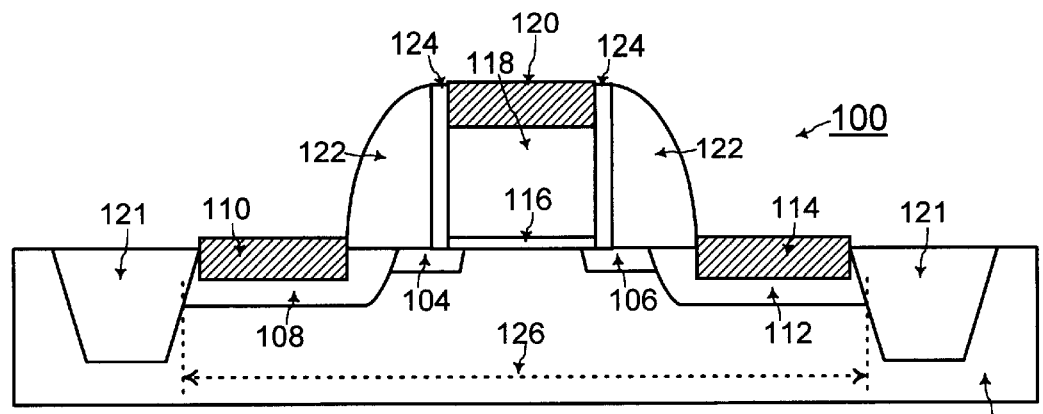
FIG. 1 shows a cross-sectional view of a conventional MOSFET (Metal Oxide Semiconductor Field Effect Transistor) with the gate structure disposed over a single surface of the semiconductor substrate.
Figure 2:
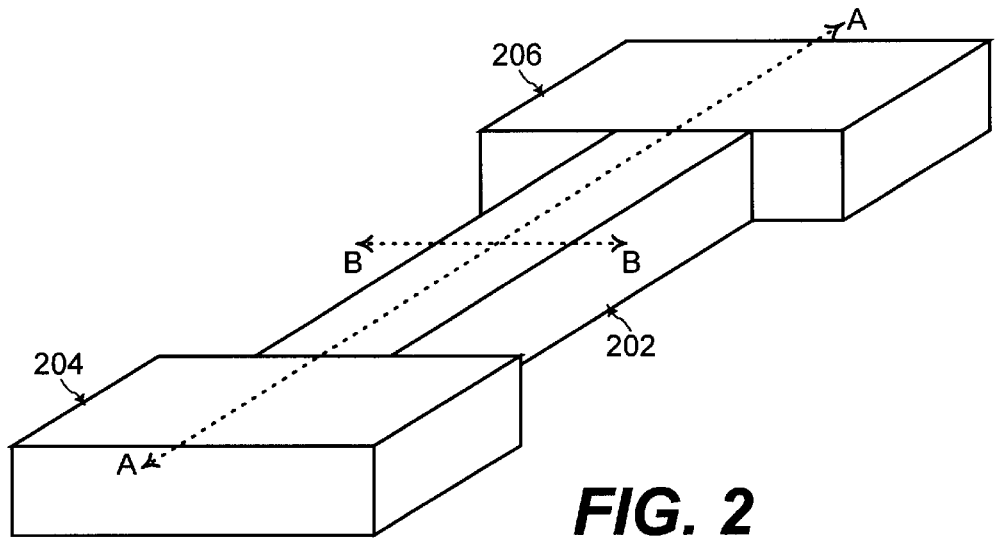
FIGS. 2, 3, 4, 5, 6, 7, 8, 9, 10, 11, 12, 13, 14, 15, 16, 17, 18, 19, and 20 show isometric, cross-sectional, and top views for illustrating the steps for fabricating a MOSFET (Metal Oxide Semiconductor Field Effect Transistor) with a three-sided gate structure that contacts a gate portion of a semiconductor pillar at three sides of the semiconductor pillar for enhanced control of charge accumulation in the gate portion of the semiconductor pillar to minimize short channel effects of the MOSFET.
Figure 3:
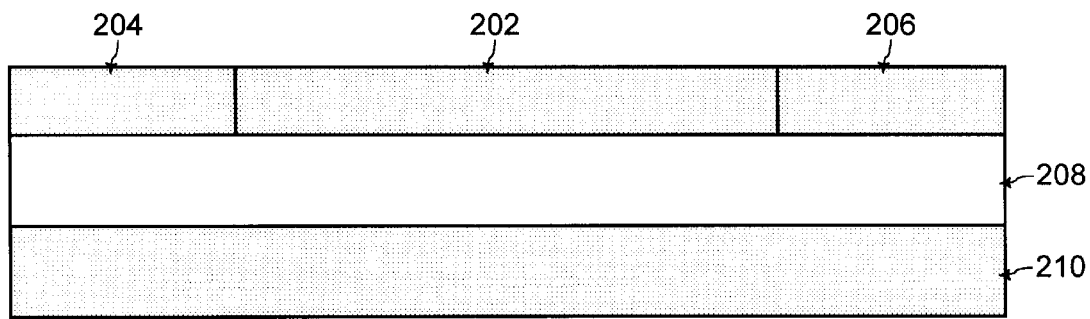

Referring to FIGS. 2 and 3, a semiconductor pillar 202, a drain contact pad 204, and a source contact pad 206 are formed on a layer of insulating material 208. The layer of insulating material 208 is formed on a semiconductor substrate 210 for SOI (semiconductor on insulator) technology, as known to one of ordinary skill in the art of integrated circuit fabrication. FIG. 2 is an isometric view of the semiconductor pillar 202, the drain contact pad 204, and the source contact pad 206, and FIG. 3 is a cross-sectional view of FIG. 2 across dashed line A—A of FIG. 2.

In one embodiment of the present invention, the semiconductor pillar 202 has a length (along the dimension of dashed line A—A in FIG. 2) between the drain contact pad 204 and the source contact pad 206 in a range of from about 800 Å (angstroms) to about 1000 Å (angstroms), a width (along the dimension of the dashed line B—B in FIG. 2) in a range of from about 50 Å (angstroms) to about 150 Å (angstroms), and a thickness in a range of from about 200 Å (angstroms) to about 400 Å (angstroms). In one embodiment of the present invention, the drain contact pad 204 and the source contact pad 206 have dimensions of about 10 μm (micrometers) by 10 μm (micrometers). The semiconductor pillar 202, the drain contact pad 204, and the source contact pad 206 are comprised of a semiconductor material such as silicon for example.

Processes for deposition and patterning of such semiconductor material for formation of the semiconductor pillar 202, the drain contact pad 204, and the source contact pad 206 are known to one of ordinary skill in the art of integrated circuit fabrication. Typically, a layer of semiconductor material such as silicon is patterned and etched to form the semiconductor pillar 202, the drain contact pad 204, and the source contact pad 206. In that case, the exposed surfaces of the semiconductor pillar 202, the drain contact pad 204, and the source contact pad 206 are oxidized for an additional HF (hydrofluoric) acid cleaning step to remove the oxide for removing any silicon surface damage in a preferred embodiment of the present invention. Such oxidation and HF (hydrofluoric) acid cleaning processes are known to one of ordinary skill in the art of integrated circuit fabrication.

Figure 4:
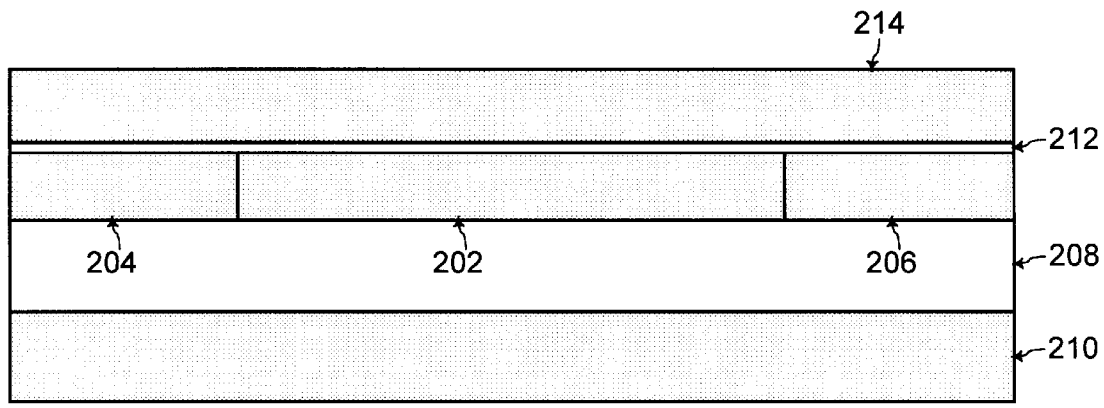
Figure 5:
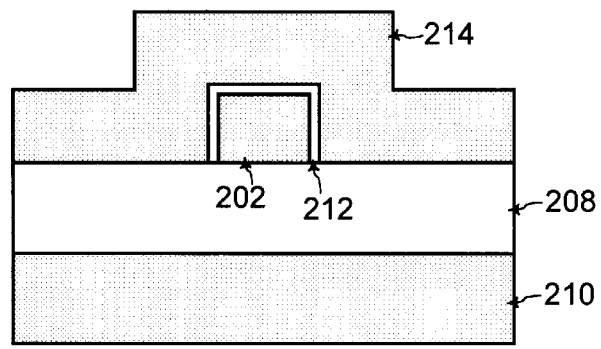

Referring to FIGS. 3 and 4, a layer of dielectric material 212 is deposited on the exposed surfaces of the semiconductor pillar 202. Referring to FIGS. 2 and 5, FIG. 5 illustrates the cross sectional view of the semiconductor pillar 202 across dashed line B—B in FIG. 2. The exposed surfaces of the semiconductor pillar 202 include the top surface and the first and second side surfaces of the semiconductor pillar 202. The bottom surface of the semiconductor pillar 202 contacts the layer of insulating material 208 and is not exposed.

In one embodiment of the present invention, the layer of dielectric material 212 is comprised of silicon dioxide ($SiO_2$). Alternatively, the layer of dielectric material 212 may be comprised of a dielectric material having a dielectric constant that is higher than the dielectric constant of silicon dioxide ($SiO_2$), such as metal oxides (i.e., aluminum oxide ($Al_2O_3$), titanium dioxide ($TiO_2$), or tantalum oxide ($Ta_2O_5$), for example). When the layer of dielectric material 212 is comprised of such dielectric material with high dielectric constant, the layer of dielectric material 212 has higher thickness to advantageously minimize charge carrier tunneling through the gate dielectric formed form the layer of dielectric material 212 as known to one of ordinary skill in the art of integrated circuit fabrication. Processes for deposition of such dielectric material are known to one of ordinary skill in the art of integrated circuit fabrication.

Further referring to FIGS. 3, 4, and 5, a layer of conductive material 214 is deposited on the layer of dielectric material 212 on the top surface and the first and second side surfaces of the semiconductor pillar 202. In one embodiment of the present invention, the layer of conductive material 214 is polysilicon having a thickness in a range of from about 2000 Å (angstroms) to about 2500 Å (angstroms). Processes for deposition of such conductive material are known to one of ordinary skill in the art of integrated circuit fabrication.

Figure 6:
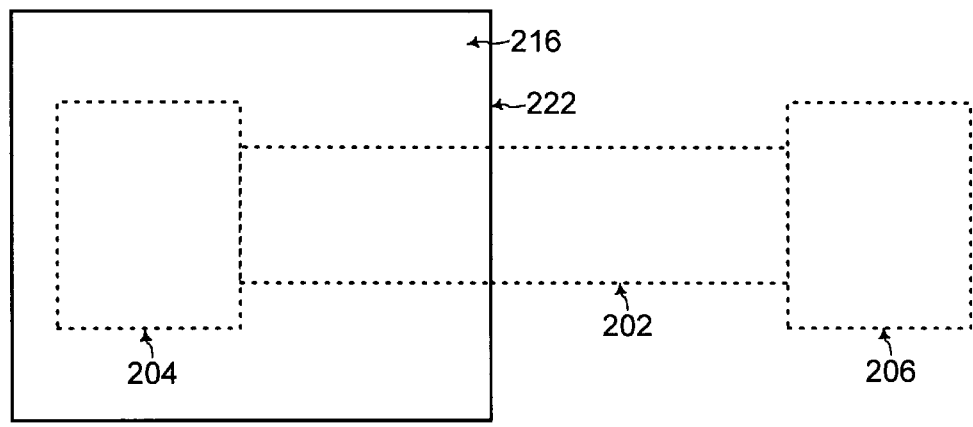

FIG. 6 shows a top view of the semiconductor pillar 202, the drain contact pad 204, and the source contact pad 206 outlined in dashed lines in FIG. 6 since the semiconductor pillar 202, the drain contact pad 204, and the source contact pad 206 are disposed under the layer of dielectric material 212 and the layer of conductive material 214. Referring to FIG. 6, a dummy dielectric structure 216 is formed to cover a portion of the conductive material 214 on the semiconductor pillar 202 while a remaining portion of the conductive material 214 is exposed.

Figure 7:
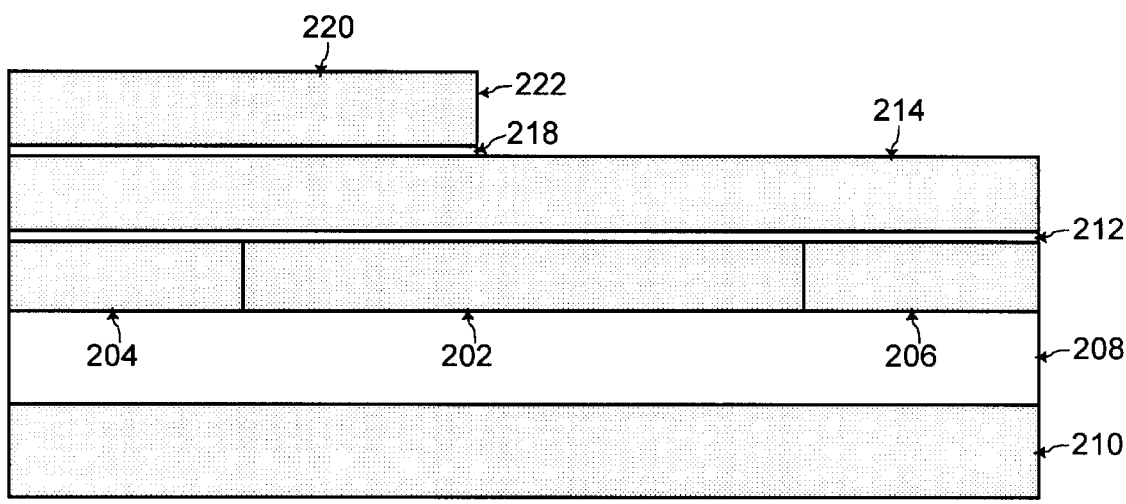

Referring to FIGS. 2 and 7, FIG. 7 shows the cross sectional view of the semiconductor pillar 202 across dashed line A—A in FIG. 2. Referring to FIGS. 6 and 7, in one embodiment of the present invention, the dummy dielectric structure 216 is comprised of a thin layer of silicon dioxide ($SiO_2$) 218 having a thickness in a range of from about 100 Å (angstroms) to about 200 Å (angstroms) and a thick layer of silicon nitride ($Si_3N_4$) having a thickness in a range of from about 1500 Å (angstroms) to about 2000 Å (angstroms). For formation of the dummy dielectric structure 216, a layer of silicon dioxide ($SiO_2$) and a layer of silicon nitride ($Si_3N_4$) are deposited and patterned to form the dummy dielectric structure 216. Processes for deposition and patterning such material are known to one of ordinary skill in the art of integrated circuit fabrication.

Figure 8:
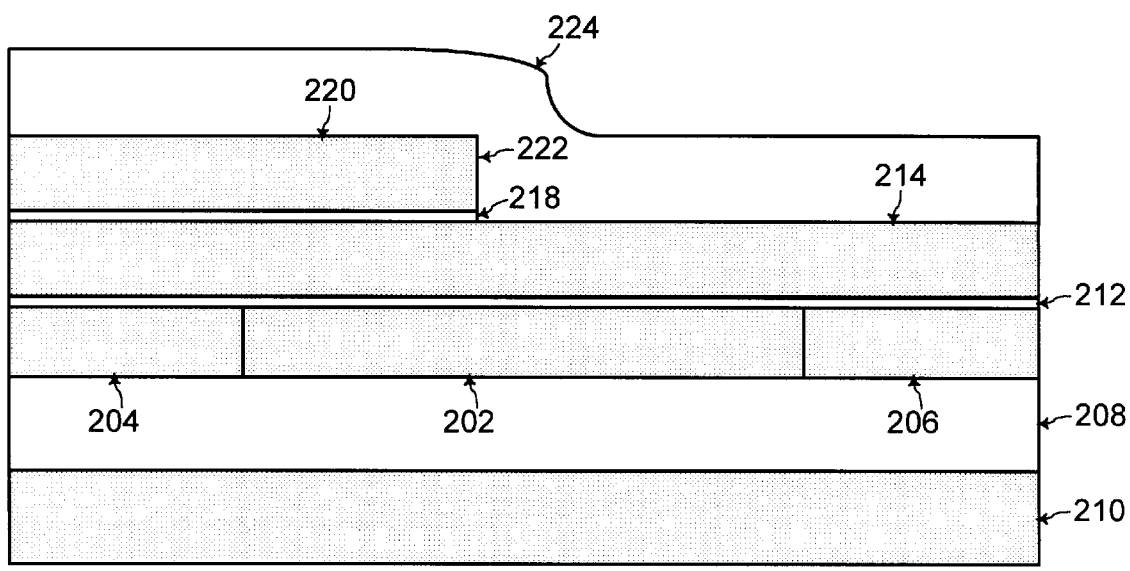

Referring to FIGS. 6 and 7, the dummy dielectric structure 216 is formed to cover a portion of the conductive material 214 on the semiconductor pillar 202 while a remaining portion of the conductive material 214 remains exposed such that a predetermined sidewall 222 of the dummy dielectric structure 216 is exposed on the layer of conductive material on the semiconductor pillar 202. Referring to FIGS. 7 and 8, a layer of hardmask dielectric 224 is conformally deposited on top and the predetermined sidewall 222 of the dummy dielectric structure 216 and on the remaining portion of the layer of conductive material 214 that is exposed. In one embodiment of the present invention, the layer of hardmask dielectric 224 is comprised of silicon dioxide ($SiO_2$) having a thickness in a range of from about 400 Å (angstroms) to about 600 Å (angstroms). Processes for deposition of such material are known to one of ordinary skill in the art of integrated circuit fabrication.

Figure 9:
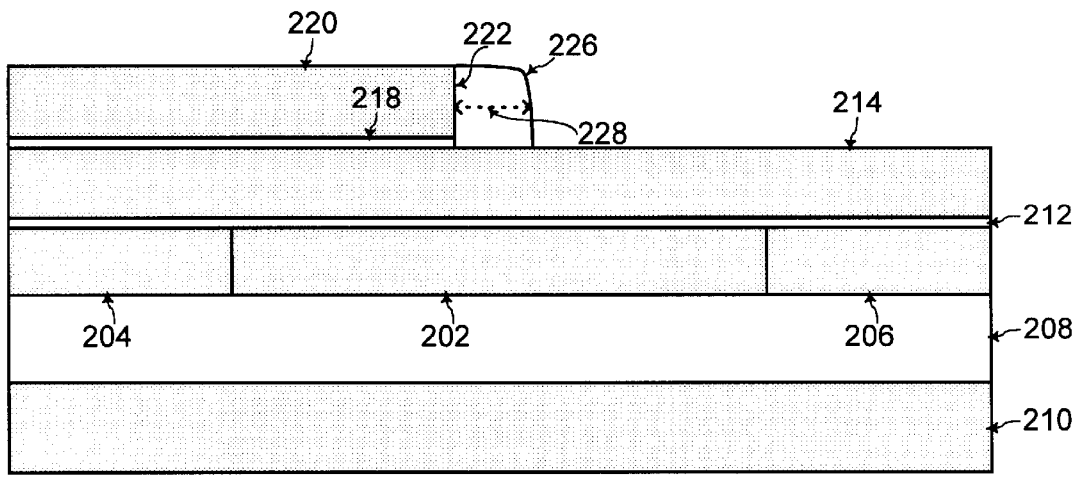

Referring to FIGS. 8 and 9, the layer of hardmask dielectric 224 is anisotropically etched such that the hardmask dielectric remains on the predetermined sidewall 222 of the dummy dielectric structure 216 to form a spacer 226 of hardmask dielectric. Processes for anisotropically etching the layer of hardmask dielectric 224 which may be comprised of silicon dioxide ($SiO_2$) for example are known to one of ordinary skill in the art of integrated circuit fabrication. The width 228 of the spacer 226 in one embodiment of the present invention is in a range of from about 30 Å (angstroms) to about 50 Å (angstroms) when the layer of hardmask dielectric 224 is comprised of silicon dioxide ($SiO_2$) having a thickness in a range of from about 400 Å (angstroms) to about 600 Å (angstroms).

Figure 10:
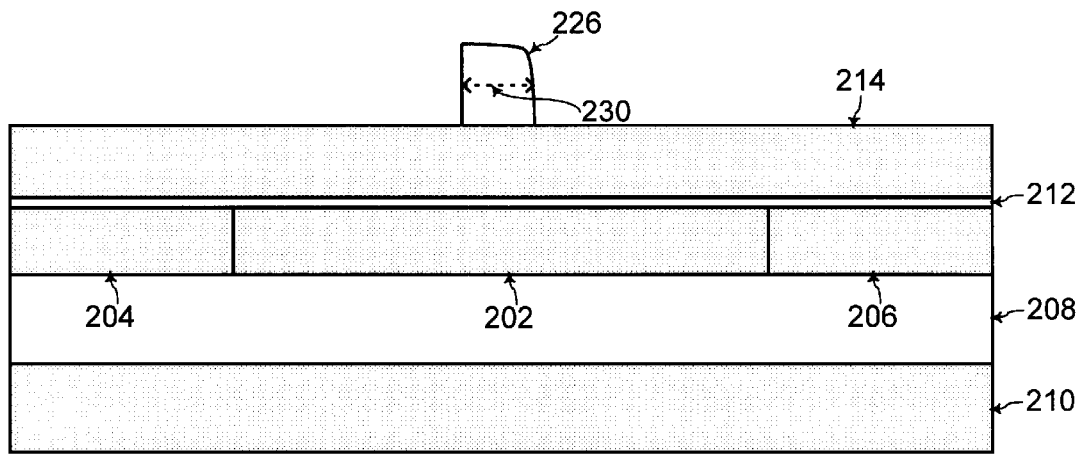

Referring to FIGS. 9 and 10, the silicon dioxide ($SiO_2$) 218 and the silicon nitride ($Si_3N_4$) 220 comprising the dummy dielectric structure 216 are etched away such that the spacer 226 remains. Processes for etching away such material of the dummy dielectric structure 216 are known to one of ordinary skill in the art of integrated circuit fabrication. Because of over-etching of the spacer 226 which may be comprised of silicon dioxide ($SiO_2$) during etching of the silicon dioxide ($SiO_2$) 218 of the dummy dielectric structure 216, the width 230 of the spacer 226 in one embodiment of the present invention is in a range of from about 20 Å (angstroms) to about 30 Å (angstroms) when the width 228 of the spacer 226 in FIG. 9 is in a range of from about 30 Å (angstroms) to about 50 Å (angstroms).

Figure 11:
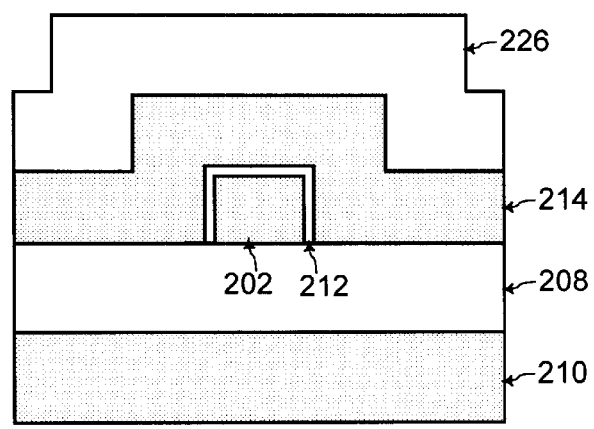

Referring to FIGS. 2 and 11, FIG. 11 shows the cross sectional view of the semiconductor pillar 202 across the dimension of dashed line B—B in FIG. 2. Referring to FIGS. 10 and 11, the spacer 226 of hardmask dielectric covers the conductive material 214 and the dielectric material 212 on the top surface and the first and second side surfaces of the semiconductor pillar 202 in a gate portion 232 of the semiconductor pillar 202.

Figure 12:
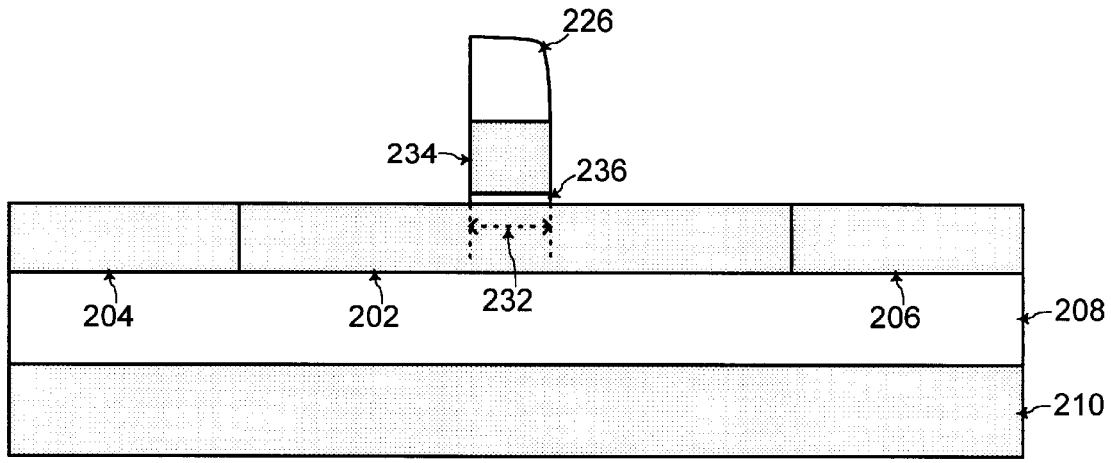
Figure 13:
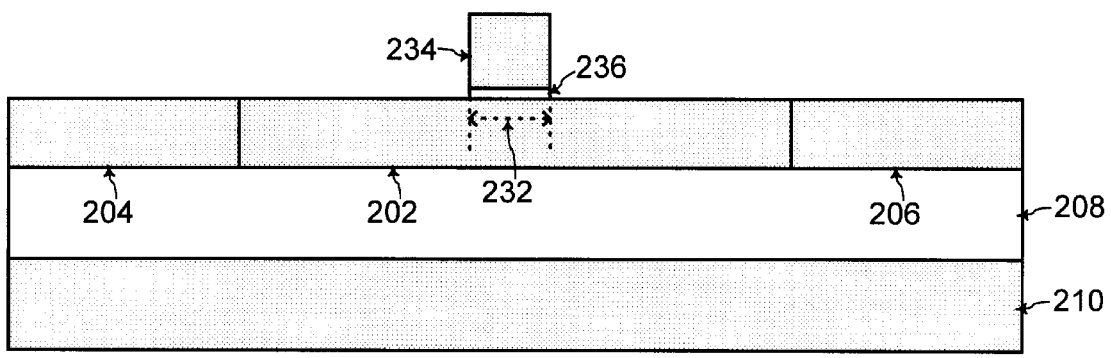

Referring to FIGS. 11 and 12, the spacer 226 of the hardmask dielectric is used as a mask to etch away any exposed region of the layer of conductive material 214 and of the layer of dielectric material 212 not covered by the spacer 226 of the hardmask dielectric. Processes for etching away any exposed region of the layer of conductive material 214 (which may be comprised of polysilicon) and of the layer of dielectric material 212 (which may be comprised of silicon dioxide ($SiO_2$) or a metal oxide) are known to one of ordinary skill in the art of integrated circuit fabrication. Referring to FIGS. 12 and 13, the spacer 226 of the hardmask dielectric is etched away. Processes for etching away the spacer 226 of the hardmask dielectric (which may be comprised of silicon dioxide ($SiO_2$)) are known to one of ordinary skill in the art of integrated circuit fabrication.

Figure 14:
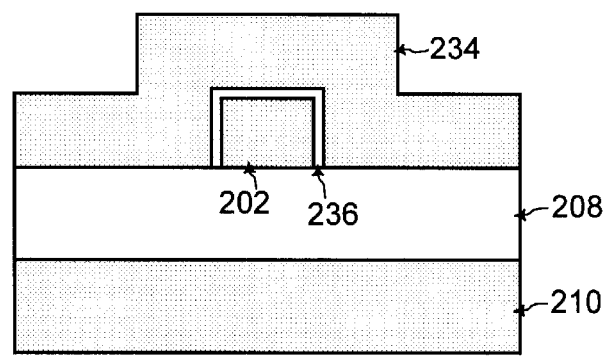

Referring to FIGS. 2 and 14, FIG. 14 shows the cross sectional view of the semiconductor pillar 202 along the dimension of the dashed line B—B in FIG. 2 after the spacer 226 of hardmask dielectric is etched away in FIG. 13. Referring to FIGS. 13 and 14, a remaining portion 234 of the conductive material of the layer of conductive material 214 remains on the top surface and the first and second side surfaces at the gate portion 232 of the semiconductor pillar 202. The dielectric material of the layer of dielectric material 212 remains on the top surface and the first and second side surfaces at the gate portion 232 of the semiconductor pillar 202 to form a three sided gate dielectric 236.

Figure 15:
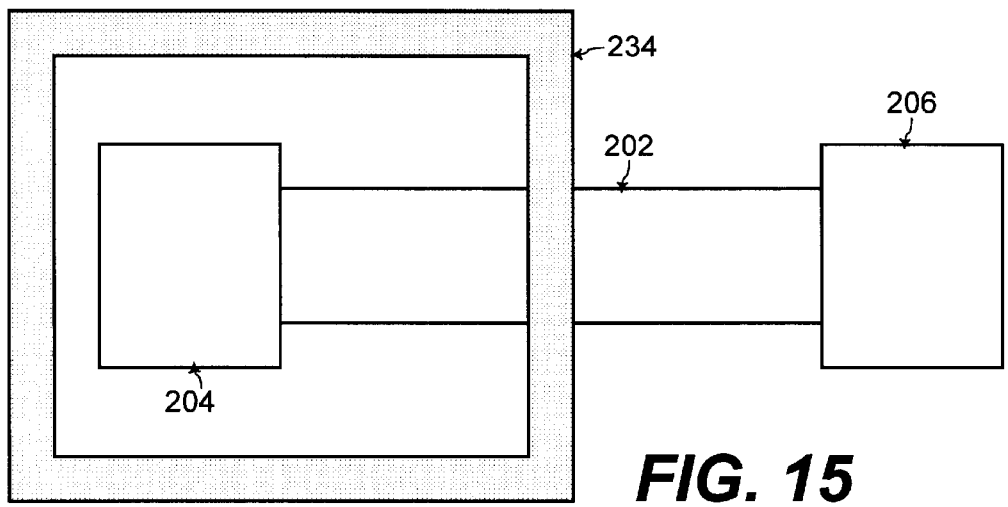
Figure 16:
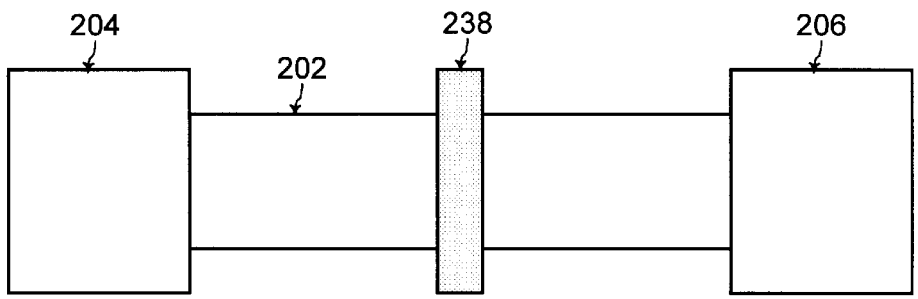

FIG. 15 shows a top view of the semiconductor pillar 202, the drain contact pad 204, and the source contact pad 206 with the remaining portion 234 of the conductive material of the layer of conductive material 214. Referring to FIGS. 6 and 15, the remaining portion 234 of the conductive material of the layer of conductive material 214 is formed around the boundary of the dummy dielectric structure 216. Referring to FIGS. 15 and 16, the remaining portion 234 of the conductive material of the layer of conductive material 214 is patterned to etch away a portion of the conductive material such that the conductive material remains substantially only at the top surface and the first and second side surfaces at the gate portion 232 of the semiconductor pillar 202 to form a three sided gate structure 238. Processes for patterning and etching the remaining portion 234 of the conductive material which may be comprised of polysilicon are known to one of ordinary skill in the art of integrated circuit fabrication.

Figure 17:
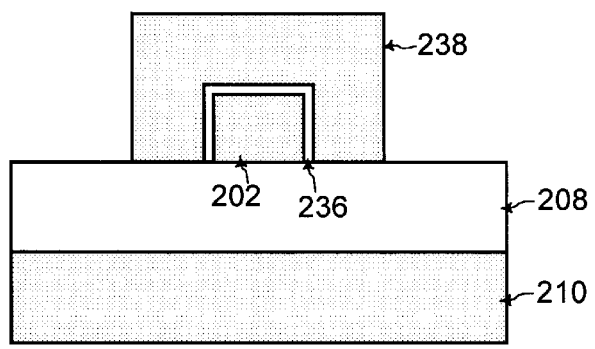
Figure 18:
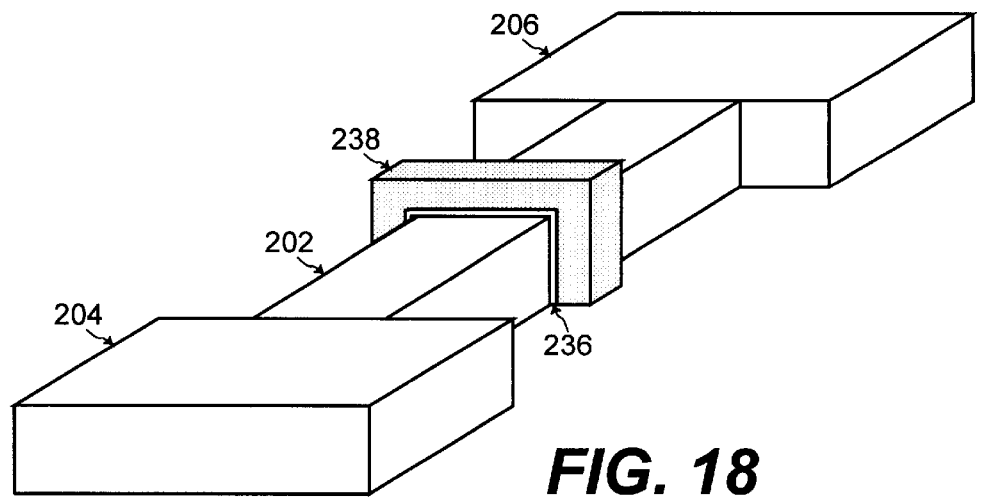

Referring to FIGS. 2 and 17, FIG. 17 shows the cross sectional view of the semiconductor pillar 202 along the dimension of the dashed line B—B in FIG. 2 after formation of the three sided gate structure 238 in FIG. 16. FIG. 18 shows an isometric view of the semiconductor pillar 202, the drain contact pad 204, and the source contact pad 206 after formation of the three sided gate dielectric 236 and the three sided gate structure 238.

Figure 19:
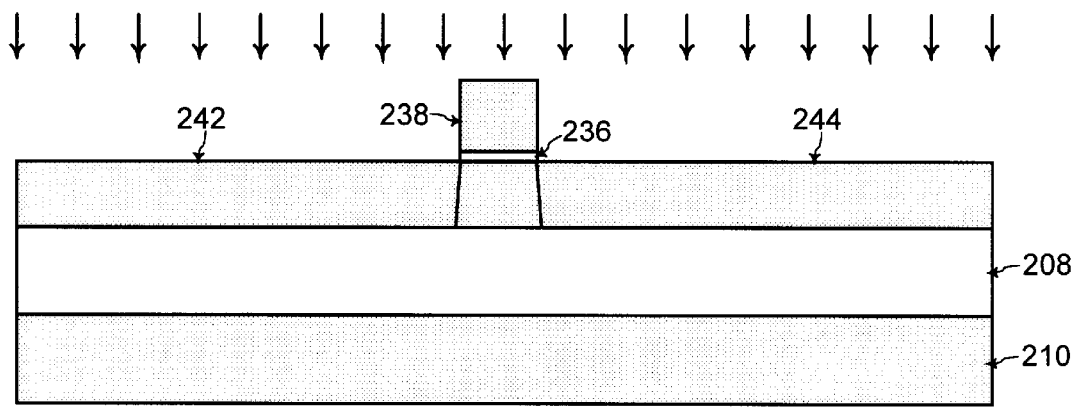

Referring to FIGS. 13 and 19, after formation of the three sided gate dielectric 236 and the three sided gate structure 238, a dopant is implanted into exposed regions of the semiconductor pillar 202, the drain contact pad 204, and the source contact pad 206 to form a drain region 242 and a source region 244 of the MOSFET. The drain region 242 is disposed within the semiconductor pillar 202 at a first side of the gate portion toward the first end of the semiconductor pillar 202 having the drain contact pad 204. The source region 244 is disposed within the semiconductor pillar 202 at a second side of the gate portion toward the second end of the semiconductor pillar 202 having the source contact pad 206.

The dopant is an N-type dopant for forming the drain region 242 and the source region 244 of an NMOSFET (N-channel Metal Oxide Semiconductor Field Effect Transistor). Alternatively, the dopant is a P-type dopant for forming the drain region 242 and the source region 244 of a PMOSFET (P-channel Metal Oxide Semiconductor Field Effect Transistor). Processes for implantation of the dopant for formation of the drain region 242 and the source region 244 are known to one of ordinary skill in the art of integrated circuit fabrication.

Figure 20:
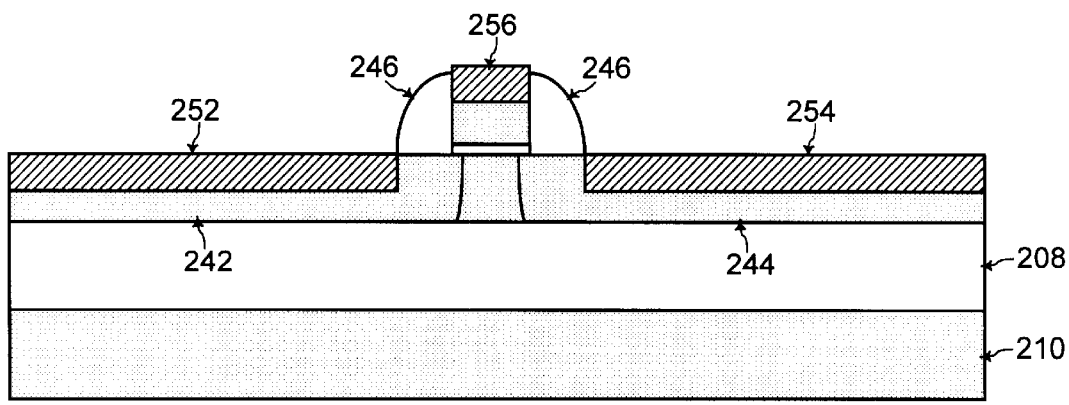

Referring to FIGS. 19 and 20, a gate spacer 246 is formed to surround the sidewalls of the gate structure 238 and the gate dielectric 236. The gate spacer 246 may be comprised of silicon dioxide ($SiO_2$), and processes for formation of such a spacer 246 are known to one of ordinary skill in the art of integrated circuit fabrication. Further referring to FIGS. 19 and 20, a drain silicide 252 is formed with the drain region 242 for providing contact to the drain of the MOSFET, and a source silicide 254 is formed with the source region 244 for providing contact to the source of the MOSFET. A gate silicide 256 is formed with the gate structure 238 for providing contact to the gate of the MOSFET. Such silicides may be comprised of one of cobalt silicide ($CoSi_2$) or titanium silicide ($TiSi_2$) for example, and processes for formation of such suicides are known to one of ordinary skill in the art of integrated circuit fabrication.

In this manner, the three-sided gate structure 238 and the three-sided gate dielectric 236 contact the gate portion 232 of the semiconductor pillar 202 at three sides of the semiconductor pillar 202 for enhanced control of charge accumulation in the gate portion 232 of the semiconductor pillar 202. With such enhanced control, short channel effects of the MOSFET formed with such a three-sided gate structure are minimized such that the dimensions of the MOSFET may be scaled down to tens of nanometers to enhance the speed performance of the MOSFET. In addition, because the MOSFET is formed with SOI (semiconductor on insulator) technology, junction capacitance is eliminated to further enhance the speed performance of the MOSFET.

The foregoing is by way of example only and is not intended to be limiting. For example, any specified material or any specified dimension of any structure described herein is by way of example only. In addition, as will be understood by those skilled in the art, the structures described herein may be made or used in the same way regardless of their position and orientation. Accordingly, it is to be understood that terms and phrases such as "top," "side," and "on" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

I claim:

1. A method for fabricating a field effect transistor, the method including the steps of:
   A. forming a semiconductor pillar on a layer of insulating material, wherein a top surface and first and second side surfaces of said semiconductor pillar are exposed;
   B. forming a layer of dielectric material on said top surface and said first and second side surfaces of said semiconductor pillar;
   C. forming a layer of conductive material on said layer of dielectric material on said top surface and said first and second side surfaces of said semiconductor pillar;
   D. forming a dummy dielectric structure that covers a portion of said layer of conductive material such that a remaining portion of said layer of conductive material on said semiconductor pillar is exposed, said dummy dielectric structure having a predetermined sidewall on said layer of conductive material on said semiconductor pillar;
   E. depositing a layer of hardmask dielectric on top and on said predetermined sidewall of said dummy dielectric structure and on said remaining portion of said layer of conductive material that is exposed;
   F. anisotropically etching said layer of hardmask dielectric such that said hardmask dielectric remains at said predetermined sidewall of said dummy dielectric structure to form a spacer of hardmask dielectric;
   G. etching away said dummy dielectric structure such that said spacer of hardmask dielectric remains, said spacer of hardmask dielectric covering said layer of conductive material on said top surface and said first and second side surfaces of said semiconductor pillar at a gate portion of said semiconductor pillar; and
   H. etching away any exposed region of said layer of conductive material and said layer of dielectric material not covered by said spacer of hardmask dielectric such that said conductive material and said dielectric material remain on said top surface and said first and second side surfaces at said gate portion of said semiconductor pillar,
   wherein said conductive material that remains on said top surface and said first and second side surfaces at said gate portion of said semiconductor pillar forms a three-sided gate structure of said field effect transistor;
   and wherein said dielectric material that remains on said top surface and said first and second side surfaces at said gate portion of said semiconductor pillar forms a three-sided gate dielectric of said field effect transistor.

2. The method of claim 1, wherein said semiconductor pillar is comprised of silicon.

3. The method of claim 1, wherein said layer of insulating material is comprised of silicon dioxide ($SiO_2$).

4. The method of claim 1, wherein said layer of dielectric material is comprised of silicon dioxide ($SiO_2$).

5. The method of claim 1, wherein said layer of conductive material is comprised of polysilicon.

6. The method of claim 1, wherein said dummy dielectric structure is comprised of silicon nitride ($Si_3N_4$).

7. The method of claim 1, wherein said layer of hardmask dielectric is comprised of silicon dioxide ($SiO_2$).

8. The method of claim 1, wherein said spacer of hardmask dielectric has a width in a range of from about 20 nanometers to about 30 nanometers.

9. The method of claim 1, further including the step of: etching away said spacer of said hardmask dielectric.

10. The method of claim 1, further including the step of: forming a drain contact pad at a first end of said semiconductor pillar; and
forming a source contact pad at a second end of said semiconductor pillar.

11. The method of claim 10, further including the step of: implanting a dopant into exposed regions of said semiconductor pillar to form a drain region within said semiconductor pillar at a first side of said gate portion toward said first end of said semiconductor pillar, and to form a source region within said semiconductor pillar at a second side of said gate portion toward said second end of said semiconductor pillar.

12. The method of claim 11, further including the step of:

forming a gate spacer to surround said gate structure and said gate dielectric.

13. The method of claim 12, further including the step of:

forming a gate silicide with said gate structure; and forming a drain silicide with said drain region and forming a source silicide with said source region.

14. A method for fabricating a MOSFET (metal oxide semiconductor field effect transistor), the method including the steps of:

forming a semiconductor pillar on a layer of insulating material, wherein a top surface and first and second side surfaces of said semiconductor pillar are exposed, and wherein said semiconductor pillar is comprised of silicon, and wherein said layer of insulating material is comprised of silicon dioxide ($SiO_2$);

forming a layer of dielectric material on said top surface and said first and second side surfaces of said semiconductor pillar, wherein said layer of dielectric material is comprised of silicon dioxide ($SiO_2$);

forming a layer of conductive material on said layer of dielectric material on said top surface and said first and second side surfaces of said semiconductor pillar, wherein said layer of conductive material is comprised of polysilicon;

forming a dummy dielectric structure that covers a portion of said layer of conductive material such that a remaining portion of said layer of conductive material on said semiconductor pillar is exposed, said dummy dielectric structure having a predetermined sidewall on said layer of conductive material on said semiconductor pillar, wherein said dummy dielectric structure is comprised of silicon nitride ($Si_3N_4$);

depositing a layer of hardmask dielectric on top and on said predetermined sidewall of said dummy dielectric structure and on said remaining portion of said layer of conductive material that is exposed, wherein said layer of hardmask dielectric is comprised of silicon dioxide ($SiO_2$);

anisotropically etching said layer of hardmask dielectric such that said hardmask dielectric remains at said predetermined sidewall of said dummy dielectric structure to form a spacer of hardmask dielectric;

etching away said dummy dielectric structure such that said spacer of hardmask dielectric remains, said spacer of hardmask dielectric covering said layer of conductive material on said top surface and said first and second side surfaces of said semiconductor pillar at a gate portion of said semiconductor pillar, wherein said spacer of hardmask dielectric that remains has a width in a range of from about 20 nanometers to about 30 nanometers;

etching away any exposed region of said layer of conductive material and said layer of dielectric material not covered by said spacer of hardmask dielectric such that said conductive material and said dielectric material remain on said top surface and said first and second side surfaces at said gate portion of said semiconductor pillar, wherein said conductive material that remains on said top surface and said first and second side surfaces at said gate portion of said semiconductor pillar forms a three-sided gate structure of said MOSFET;

and wherein said dielectric material that remains on said top surface and said first and second side surfaces at said gate portion of said semiconductor pillar forms a three-sided gate dielectric of said MOSFET;

etching away said spacer of said hardmask dielectric;

forming a drain contact pad at a first end of said semiconductor pillar;

forming a source contact pad at a second end of said semiconductor pillar;

implanting a dopant into exposed regions of said semiconductor pillar to form a drain region within said semiconductor pillar at a first side of said gate portion toward said first end of said semiconductor pillar, and to form a source region within said semiconductor pillar at a second side of said gate portion toward said second end of said semiconductor pillar;

forming a gate spacer to surround said gate structure and said gate dielectric;

forming a gate silicide with said gate structure; and forming a drain silicide with said drain region and forming a source silicide with said source region.

* * * * *